(12) United States Patent
Murata

(10) Patent No.: US 7,150,147 B2
(45) Date of Patent: Dec. 19, 2006

(54) EXHAUST SYSTEM

(75) Inventor: Kiyohito Murata, Susono (JP)

(73) Assignee: Toyota Jidosha Kabushiki Kaisha, Aichi-ken (JP)

( * ) Notice: Subject to any disclaimer, the term of this patent is extended or adjusted under 35 U.S.C. 154(b) by 0 days.

(21) Appl. No.: 10/540,529

(22) PCT Filed: Dec. 23, 2003

(86) PCT No.: PCT/IB03/06163

§ 371 (c)(1),
(2), (4) Date: Jun. 24, 2005

(87) PCT Pub. No.: WO2004/059139

PCT Pub. Date: Jul. 15, 2004

(65) Prior Publication Data

US 2006/0053771 A1   Mar. 16, 2006

(30) Foreign Application Priority Data

Dec. 26, 2002 (JP) .............................. 2002-377862
Jan. 8, 2003 (JP) .............................. 2003-002338

(51) Int. Cl.
*F01N 3/00* (2006.01)
(52) U.S. Cl. ........................... 60/287; 60/288; 60/298; 60/320
(58) Field of Classification Search ................ 60/284, 60/287, 288, 298, 299
See application file for complete search history.

(56) References Cited

U.S. PATENT DOCUMENTS

| | | | | |
|---|---|---|---|---|
| 4,023,360 A | * | 5/1977 | Wossner et al. ............... | 60/277 |
| 4,685,291 A | * | 8/1987 | Ha ............................... | 60/286 |
| 5,250,268 A | * | 10/1993 | Geiger ........................ | 422/174 |
| 6,009,703 A | * | 1/2000 | Bouchez et al. ............... | 60/298 |
| 6,347,511 B1 | * | 2/2002 | Haines ......................... | 60/298 |
| 6,422,007 B1 | * | 7/2002 | Hartick ......................... | 60/298 |
| 6,568,179 B1 | * | 5/2003 | Deeba .......................... | 60/298 |
| 6,571,552 B1 | * | 6/2003 | Ban et al. ...................... | 60/312 |
| 2002/0117773 A1 | | 8/2002 | Yamada et al. | |

FOREIGN PATENT DOCUMENTS

| | | |
|---|---|---|
| FR | 2 698 909 A1 | 6/1994 |
| JP | 06-002539 | 1/1994 |
| JP | 06-081639 | 3/1994 |

(Continued)

OTHER PUBLICATIONS

PCT International Search Report for PCT/IB03/06163 dated May 3, 2004.

*Primary Examiner*—Thomas Denion
*Assistant Examiner*—Diem Tran
(74) *Attorney, Agent, or Firm*—Finnegan, Henderson, Farabow, Garrett & Dunner, LLP

(57) ABSTRACT

An exhaust system (1) is provided with an exhaust passage that allows exhaust gas discharged from an internal combustion engine to pass therethrough, an exhaust emission control unit including a catalyst (2,3) such as a three-way catalyst (27) to purify the exhaust gas, and an exhaust heat collecting unit that converts thermal energy of the exhaust gas into electric energy. The exhaust passage (25) is formed in the center of the exhaust system provided with the exhaust emission control unit. By-pass passages (26) are formed at both sides of the exhaust passage (25) through which the exhaust gas flows without passing through the exhaust emission control unit. The exhaust heat collecting unit (29) is provided on the outer side of each of the by-pass passages (26).

17 Claims, 11 Drawing Sheets

FOREIGN PATENT DOCUMENTS

| | | |
|---|---|---|
| JP | 10-234194 | 9/1998 |
| JP | 11-036981 | 2/1999 |
| JP | 11-122960 | 4/1999 |
| JP | 2000-18095 | 1/2000 |
| JP | 2000-352313 | 12/2000 |

* cited by examiner

EXHAUST SYSTEM

INCORPORATION BY REFERENCE

The disclosure of Japanese Patent Applications No. 2002-377862 filed on Dec. 26, 2002 and No. 2003-002338 filed on Jan. 8, 2003 including the specifications, drawings and abstracts are incorporated herein by reference in their entireties.

BACKGROUND OF THE INVENTION

1. Field of Invention

The invention relates to an exhaust system that purifies exhaust gas using catalyst and converts thermal energy of the exhaust gas into electric energy.

2. Description of Related Art

Generally, an exhaust system includes an exhaust emission catalyst such as a three-way catalyst to purify exhaust gas discharged from an engine by removing hazardous substance contained in the exhaust gas, for example, carbon monoxide, hydrocarbon, nitrogen oxides and the like. The catalyst becomes effective to purify the exhaust gas when it is activated at its activated temperature in the range between 350° C. and 800° C., for example.

Substantially high thermal energy of the exhaust gas at a high temperature is partially used for increasing the temperature of the exhaust emission catalyst until it reaches the activated temperature. The rest of the thermal energy of the exhaust gas, however, is dispersed without being collected. An exhaust heat power generation apparatus has been developed to collect the thermal energy through conversion thereof into electric energy.

In a certain type of the aforementioned exhaust heat power generation apparatus, a thermoelectric converting module is interposed between an exhaust pipe (high temperature side) through which the exhaust gas flows and a cooling unit (low temperature side), and each thermoelectric converting element of the thermoelectric converting module generates power in accordance with the temperature difference between the high temperature side and the low temperature side (Related Art 1: JP-A-10-234194). The temperature difference has to be increased while raising the temperature at the high temperature side so as to improve the thermoelectric conversion efficiency. In the other type of the exhaust heat power generation apparatus, the catalyst provided in an exhaust passage is used for purifying the exhaust gas as well as increasing the exhaust gas temperature (the temperature at the high temperature side of the thermoelectric converting module) under the reaction heat. Under high load operation the exhaust gas flow from the engine can be split off and a part of it redirected through a by-pass which contains another catalyst (Related Art 2: JP-A-2000-352313). In order to protect the thermoelectric converting-element from exceeding its heat resisting temperature, e.g. during high load operation, the exhaust gas flow can also be redirected via a by-pass (Related Art 3: JP-06-081639).

Generally, in the exhaust system, when the catalytic temperature is low, for example, upon start-up of an engine, it has to be rapidly increased for smooth operation of the engine. Accordingly the exhaust emission catalyst is provided at a position in the exhaust system where the exhaust gas at high temperature (with high thermal energy) passes, for example, in the vicinity of an exhaust manifold and the like. Then an exhaust heat power generation apparatus is provided downstream of the exhaust emission catalyst in the exhaust system, for example, at a position near a sub-muffler. The temperature of the exhaust gas passing at the position downstream of the exhaust catalyst, however, becomes low because it has been used for increasing the catalytic temperature or it has been dispersed as it flows, resulting in decrease in the thermal energy. As a result, the thermoelectric conversion efficiency of the exhaust heat power generation apparatus is decreased, failing to effectively collect the thermal energy.

Under a high load of the engine (at a high engine speed), the exhaust emission catalytic temperature becomes considerably high as it is heated by the exhaust gas at high temperature in the vicinity of the exhaust manifold. When the catalytic temperature exceeds the activated temperature, its purification effect is deteriorated, which may thermally degrade the catalyst. Conventionally in the exhaust system, when the catalytic temperature exceeds the activated temperature, the engine is operated in a fuel-rich state so as to decrease the catalytic temperature. This may increase the fuel supply quantity, resulting in deteriorated fuel efficiency.

SUMMARY OF THE INVENTION

It is an object of the invention to provide an exhaust system that prevents degradation of the catalyst while improving the fuel efficiency.

The exhaust system according to one aspect of the invention includes a primary exhaust emission control unit for purifying the exhaust gas and a first exhaust heat collecting unit for collecting the thermal energy through conversion thereof into electric energy. The exhaust system includes a second passage through which the exhaust gas flows without passing through the primary exhaust emission control unit in addition to the first passage that allows the exhaust gas to flow therethrough. The exhaust system includes the primary exhaust emission control unit within the first passage so as to purify the exhaust gas flowing therethrough. The exhaust system includes a control member that serves to change a flow of gas between the first passage and the second passage. In the case where the catalytic temperature becomes high, the exhaust gas is controlled to flow through the second passage in the exhaust system so as to avoid excessive increase in the catalytic temperature owing to the exhaust gas at high temperature. This makes it possible to prevent thermal degradation in the catalyst. This may also eliminate the need for preventing the rise in the catalytic temperature by operating the engine in a fuel-rich state to decrease the exhaust gas temperature. Furthermore, the thermal energy of the exhaust gas can be collected as electric energy, resulting in improved fuel efficiency.

The exhaust system further may include a secondary exhaust emission control unit provided on an exhaust passage where the first passage and the second passage are joined.

In the case where the secondary exhaust emission control unit is allowed to purify the exhaust gas in the exhaust system, the control member serves to control the flow of the exhaust gas into the second passage. If the exhaust gas can be purified by the secondary exhaust emission control unit, the first exhaust heat collecting unit is capable of collecting the thermal energy from the exhaust gas, resulting in improved fuel efficiency.

In the exhaust system, the operation of the control member may be controlled based on the temperature in the primary exhaust emission control unit or the temperature in the secondary exhaust emission control unit. The control member is operated such that the exhaust gas flows through the second passage when the temperature either in the primary exhaust emission control unit or the secondary exhaust emission control unit exceeds a predetermined temperature. The predetermined temperature is determined based on an activated temperature of the catalyst in the primary exhaust emission control unit or the secondary exhaust emission control unit.

In the exhaust system, the operation of the control member is controlled based on the temperature in the primary exhaust emission control unit or the secondary exhaust emission control unit. For example, if the catalytic temperature in the primary exhaust emission control unit becomes lower, the flow rate of the exhaust gas flowing through the first passage is increased by reducing the flow rate of the exhaust gas flowing through the second passage such that the thermal energy of the exhaust gas is used for increasing the catalytic temperature in the primary exhaust emission control unit. Meanwhile if the catalytic temperature in the primary exhaust emission control unit becomes higher, the flow rate of the exhaust gas flowing through the second passage is increased to reduce the flow rate of the exhaust gas flowing through the first passage so as to decrease the catalytic temperature. The thermal energy of the exhaust gas is not used for increasing the catalytic temperature but collected by the first exhaust heat collecting unit. Accordingly the rise in the catalytic temperature owing to the exhaust gas at high temperature may be avoided, preventing thermal deterioration in the catalyst. Furthermore, the thermal energy of the exhaust gas may be efficiently used as the electric energy. The operation of the control member is controlled in accordance with the catalytic temperature in the secondary exhaust emission control unit. The exhaust gas can be purified in the secondary exhaust emission control unit when the catalytic temperature therein reaches the activated temperature. Accordingly the flow rate of the exhaust gas flowing through the second passage is increased to reduce the flow rate of the exhaust gas flowing through the first passage such that the thermal energy of the exhaust gas can be collected by the first exhaust heat collecting unit.

The exhaust system may include a heat exchange member in the second passage for transferring heat of the exhaust gas to the first exhaust heat collecting unit, and the heat exchange member is provided with a catalyst for purifying the exhaust gas.

The exhaust system may include the heat exchange member that transfers the thermal energy of the exhaust gas to the high temperature side of the first exhaust heat collecting unit. The heat exchange member is provided with the catalyst for purifying the exhaust gas flowing through the second passage. In the exhaust system, the exhaust gas is purified in the second passage, and the heat exchange member serves to absorb the reaction heat in the catalyst as well as the thermal energy of the exhaust gas. The resultant amount of the thermal energy collected by the first exhaust heat collecting unit is increased.

In the exhaust system, the first passage and the second passage may be combined into a single structure. The first passage is formed in a center of the structure, and the second passage is formed on an outer periphery of the first passage.

In the exhaust system, the second passage is formed on the outer side of the first passage formed in the center of the structure, and the first exhaust heat collecting unit is provided on the outer side of the second passage. The first exhaust heat collecting unit is structured to convert the thermal energy of the exhaust gas flowing through the second passage into electric energy. In the exhaust system, the high temperature exhaust gas (exhibiting higher thermal energy) flowing through the first passage formed in the center of the structure makes it possible to rapidly increase the catalytic temperature.

In the exhaust system, the aforementioned structure may be placed in the vicinity of an exhaust manifold in an internal combustion engine.

The thermal energy of the exhaust gas discharged from the exhaust manifold in the exhaust system is unlikely to be reduced in the vicinity of the exhaust manifold (downstream of the exhaust manifold through which the high temperature exhaust gas is discharged). It is preferable, therefore, to provide the structure in the vicinity of the exhaust manifold as close as possible. Alternatively, the structure may be provided within the exhaust manifold if such arrangement is available.

In the exhaust system, the control member may serves to change each flow rate of the exhaust gas flowing into the first passage and the second passage from the internal combustion engine. In the aforementioned system, the flow rate of the exhaust gas flowing through the second passage can be adjusted.

The exhaust system is provided with a second exhaust heat collecting unit including a thermo electric element downstream of the secondary exhaust emission control unit (thermoelectric converting member).

In the exhaust system, the second exhaust heat collecting unit is provided for improving the efficiency of collecting the thermal energy of the exhaust gas as the electric energy. This makes it possible to collect the thermal energy of the exhaust gas that has not been collected in the first exhaust heat collecting unit, as the electric energy, resulting in improved fuel efficiency. This may also allow the exhaust gas temperature to be further decreased, increasing engine outputs.

In the exhaust system, the catalyst may be carried on the heat exchange member.

The aforementioned exhaust system is provided with a heat exchange fin of the heat exchange member. The catalyst is carried on the heat exchange fin for purifying the exhaust gas flowing through the second passage. The exhaust system purifies the exhaust gas in the second passage, and allows the heat exchange fin to absorb the reaction heat in the catalyst in addition to the thermal energy of the exhaust gas so as to increase the amount of the thermal energy collected by the first exhaust heat collecting unit.

In the exhaust system, the control member may be formed into a valve that is operated to close and open the first passage and/or the second passage at a predetermined degree.

In the aforementioned exhaust system, each flow rate of the exhaust gas flowing through the first passage and the second passage can be finely adjusted with the valve that is opened/closed at the predetermined degree.

DETAILED DESCRIPTION OF THE EMBODIMENTS

Figure 1:
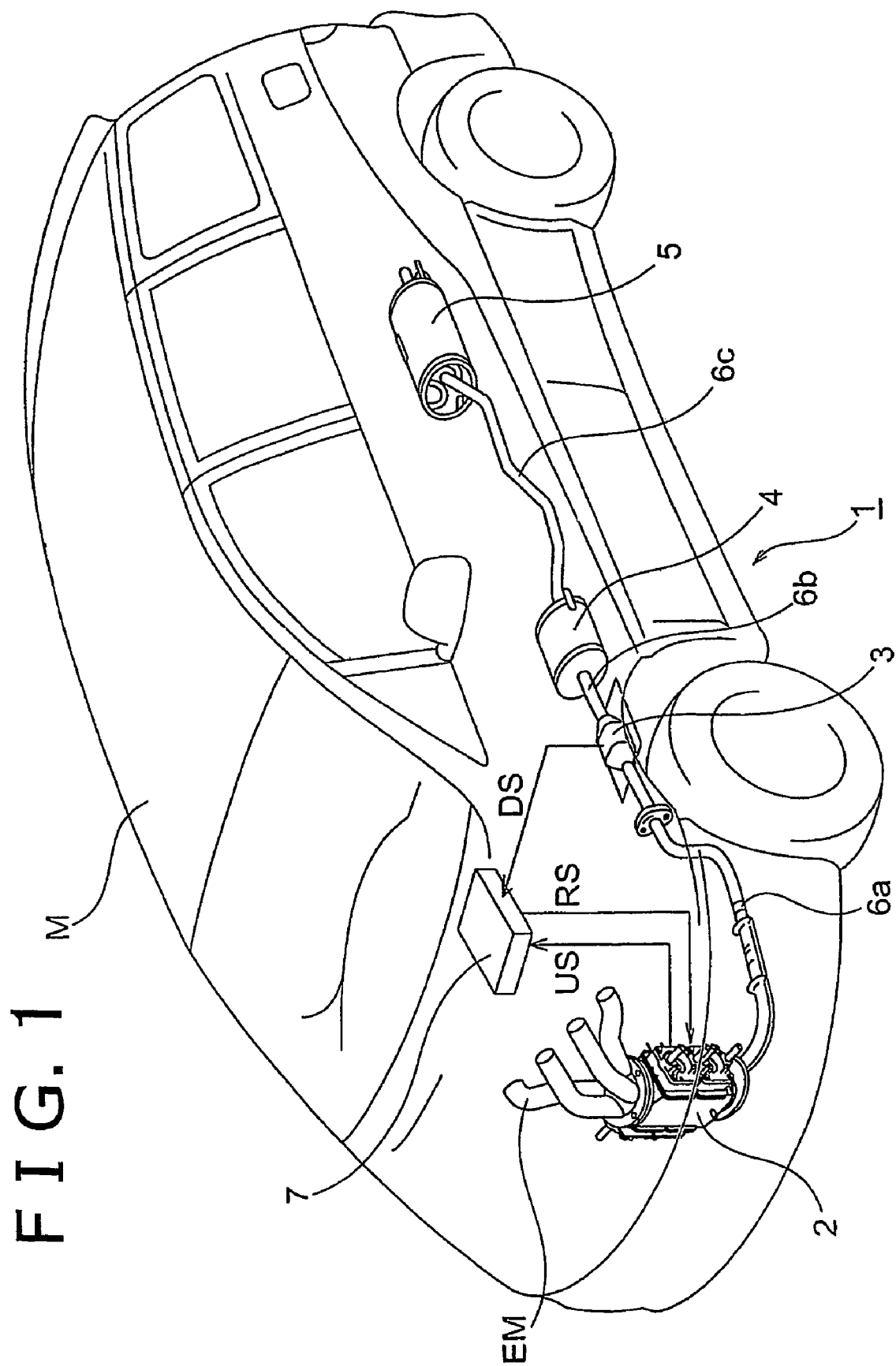
FIG. 1 is a schematic overall view of an exhaust system according to a first embodiment of the invention.

Embodiments of an exhaust system according to the invention will be described referring to the drawings.

In this embodiment, an exhaust system is mounted on a vehicle for purifying the exhaust gas from the engine while converting the thermal energy of the exhaust gas into electric energy. The exhaust system according to the embodiment is provided with two exhaust emission catalysts, one is placed in the vicinity of the exhaust manifold (hereinafter referred to as an upstream catalyst), and the other is placed downstream thereof (hereinafter referred to as a downstream catalyst). The upstream catalyst in the vicinity of the exhaust manifold is provided with an exhaust heat power generation unit. In this embodiment, no additional exhaust heat power generation apparatus other than the aforementioned exhaust heat power generation unit is provided. In the other embodiment to be described later, an additional, exhaust heat power generation apparatus is provided.

A structure of the exhaust system of this embodiment will be described referring to FIG. 1 as a schematic overall view of the exhaust system.

An exhaust system 1 is mounted on a vehicle M, constituting an exhaust system downstream of an exhaust manifold EM of a four-cylinder engine (not shown). The exhaust system 1 mainly includes an upstream catalyst 2 with an exhaust emission purifying function, e.g. a primary exhaust emission control unit, and a thermoelectric converting function, e.g. a first exhaust heat collecting unit, a downstream catalyst 3 with an exhaust emission purifying function, e.g. a secondary exhaust emission control unit, at the downstream side, a sub muffler 4, and a main muffler 5. The exhaust gas discharged from each of the cylinders of the engine is joined at the exhaust manifold EM. The upstream catalyst 2 provided in the vicinity of the exhaust manifold EM is connected with an exhaust pipe 6a via a ball joint mechanism (not shown). The downstream catalyst 3 is provided at a downstream end portion of the exhaust pipe 6a. An exhaust pipe 6b is connected with the downstream catalyst 3. The sub muffler 4 is provided at a downstream end of the exhaust pipe 6b. An exhaust pipe 6c is connected with the sub muffler 4. The main muffler 5 is provided at a downstream end of the exhaust pipe 6c via a ball joint mechanism (not shown). A tail pipe (not shown) is provided downstream of the main muffler 5.

The upstream catalyst 2 has an exhaust passage, as a first passage, that pierces through the center thereof, and by-pass passages, as a second passage, at both sides of the exhaust passage. The exhaust passage of the upstream catalyst 2 is provided with the three-way catalyst for removing the carbon monoxide, hydrocarbon, and the nitrogen oxides. The upstream catalyst 2 admits the flow of the exhaust gas at a high temperature (high thermal energy) from the exhaust manifold EM. In a cold state upon start-up of the engine, the upstream catalyst 2 serves to purify the exhaust gas until the temperature of the three-way catalyst of the downstream catalyst 3 reaches the activated temperature to start purifying the exhaust gas. The upstream catalyst 2 is provided with exhaust heat power generation units at both sides of the exhaust passage, each of which converts the thermal energy of the exhaust gas passing through the by-pass passage into electric energy so as to be charged in a battery (not shown) via a DC/DC converter (not shown) and the like. When the upstream catalyst 2 is no longer required to purify the exhaust gas with the three-way catalyst in the exhaust passage, that is, the three-way catalyst provided in the downstream catalyst 3 is heated to reach the activated temperature so as to purify the exhaust gas, the upstream catalyst 2 starts conducting exhaust heat power generation. The structure of the upstream catalyst 2 will be described in detail later.

The downstream catalyst 3 is filled with the three-way catalyst for removing the carbon monoxide, hydrocarbon, and nitrogen oxides. As the downstream catalyst 3 admits the exhaust gas at a temperature lower than that of the exhaust gas (lower thermal energy) passing through the upstream catalyst 2, it starts purifying the exhaust gas at a high temperature in a high load of the engine, more specifically, at a time when the temperature of the three-way catalyst reaches the activated temperature to start purifying the exhaust gas.

The three-way catalyst provided in the upstream catalyst 2 is equivalent to that provided in the downstream catalyst 3. The three-way catalyst in the upstream catalyst 2 is likely to be thermally degraded under the high heat of the exhaust gas. As a result, more three-way catalyst is provided in the upstream catalyst 2 than in the downstream catalyst 3. The three-way catalyst is formed as a pellet of various metals or metal oxides and activated at the activated temperature ranging between 350° and 800° C., for example. The three-way catalyst exhibits the catalytic function in the aforementioned activated temperature range. The temperature of the three-way catalyst in each of the upstream catalyst 2 and the downstream catalyst 3 is detected by a thermoelectric couple. Temperature signals US, DS each representing the detected temperature of the three-way catalyst in the upstream catalyst 2 and the downstream catalyst 3 are transmitted to an engine ECU (Electronic Control Unit) 7.

The sub muffler 4 of a small type is a noise eliminator that assists a noise eliminating function of the main muffler 5. The sub muffler 4 is provided upstream of the main muffler 5 for reducing the acoustic energy of the exhaust gas. The sub muffler 4 does not have to be provided as the exhaust noise in the exhaust system becomes relatively smaller resulting from each function of the upstream and downstream catalyst 2 and 3, respectively compared with generally employed exhaust system.

The main muffler 5 is a main noise eliminator that is larger than the sub muffler 4 and has a greater noise eliminating function than that of the sub muffler 4. The main muffler 5 is provided downstream of the sub muffler 4 for further reducing the acoustic energy which has been reduced by the sub muffler 4 to a certain extent.

The engine ECU 7 includes a CPU (Central Processing Unit), a ROM (Read Only Memory), a RAM (Random Access Memory) and the like. The engine ECU 7 sets various control values based on the detected values sent from various sensors for controlling the engine and elements related thereto. The engine ECU 7 further controls the flow rate of the exhaust gas flowing through the exhaust passage and the by-pass passages in the upstream catalyst 2 of the exhaust system 1.

Figure 2:
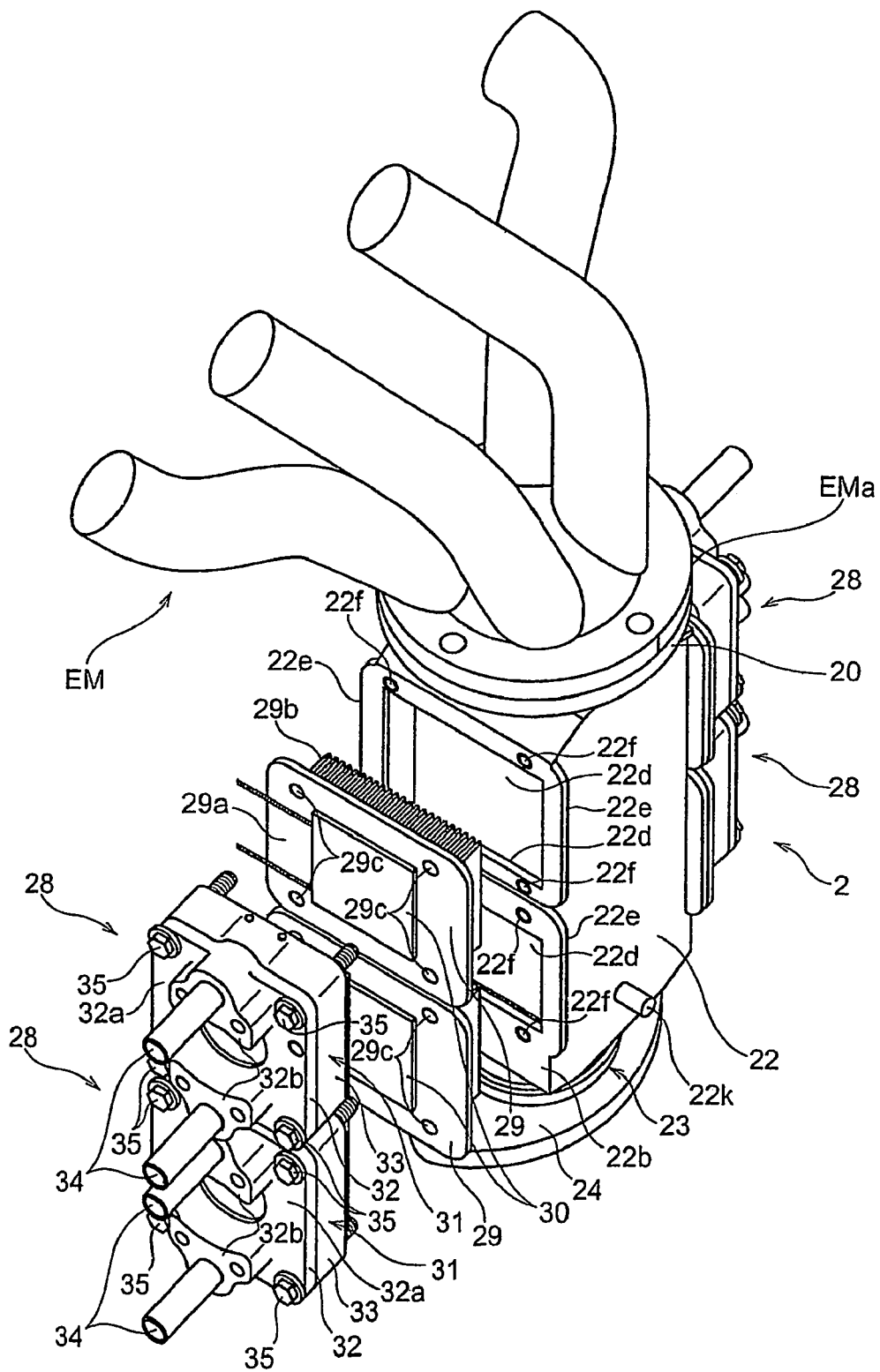
FIG. 2 is an exploded perspective view of a part of an upstream catalyst shown in FIG. 1.
Figure 3:
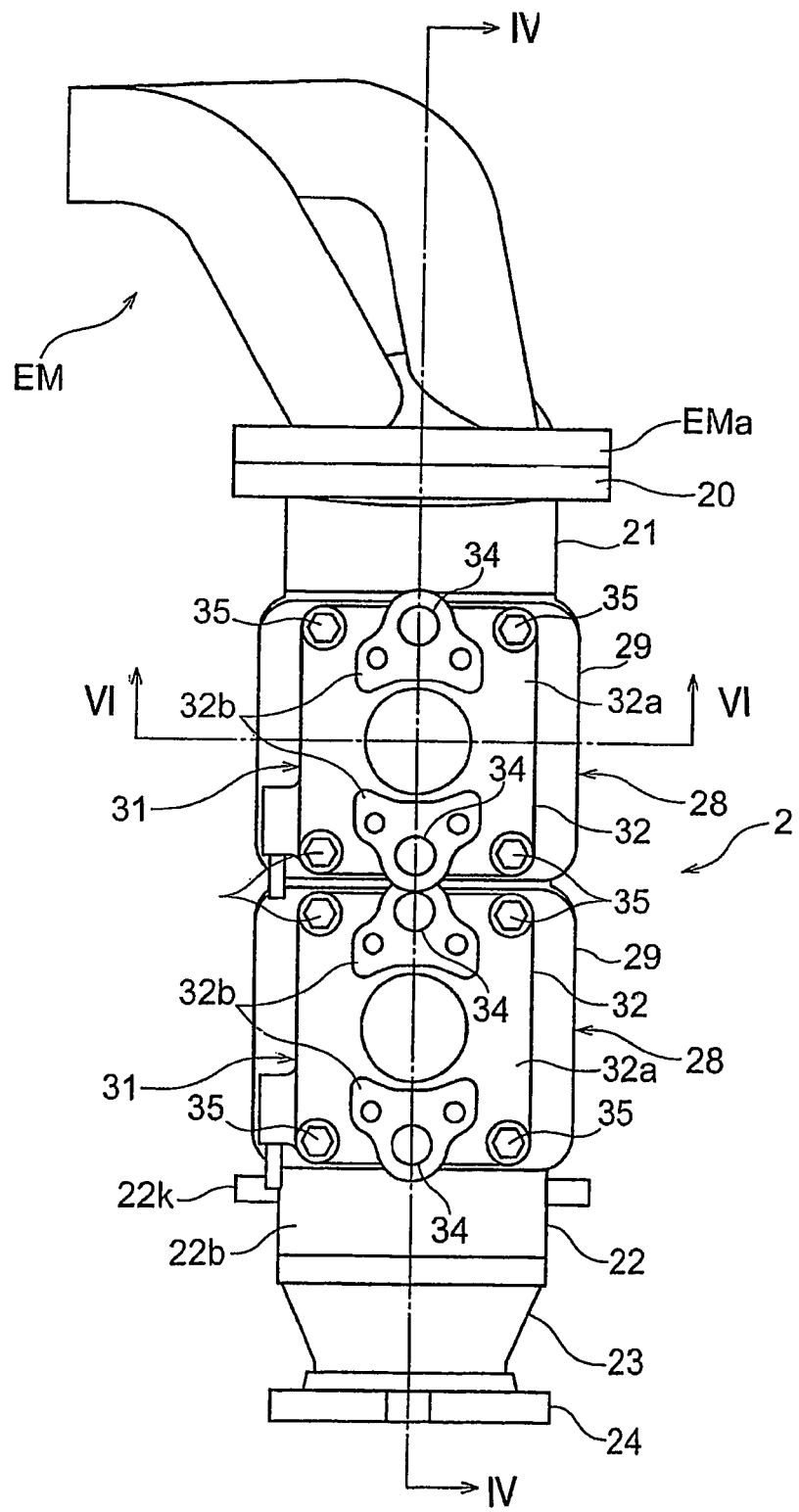
FIG. 3 is a side view of the upstream catalyst shown in FIG. 1.
Figure 4:
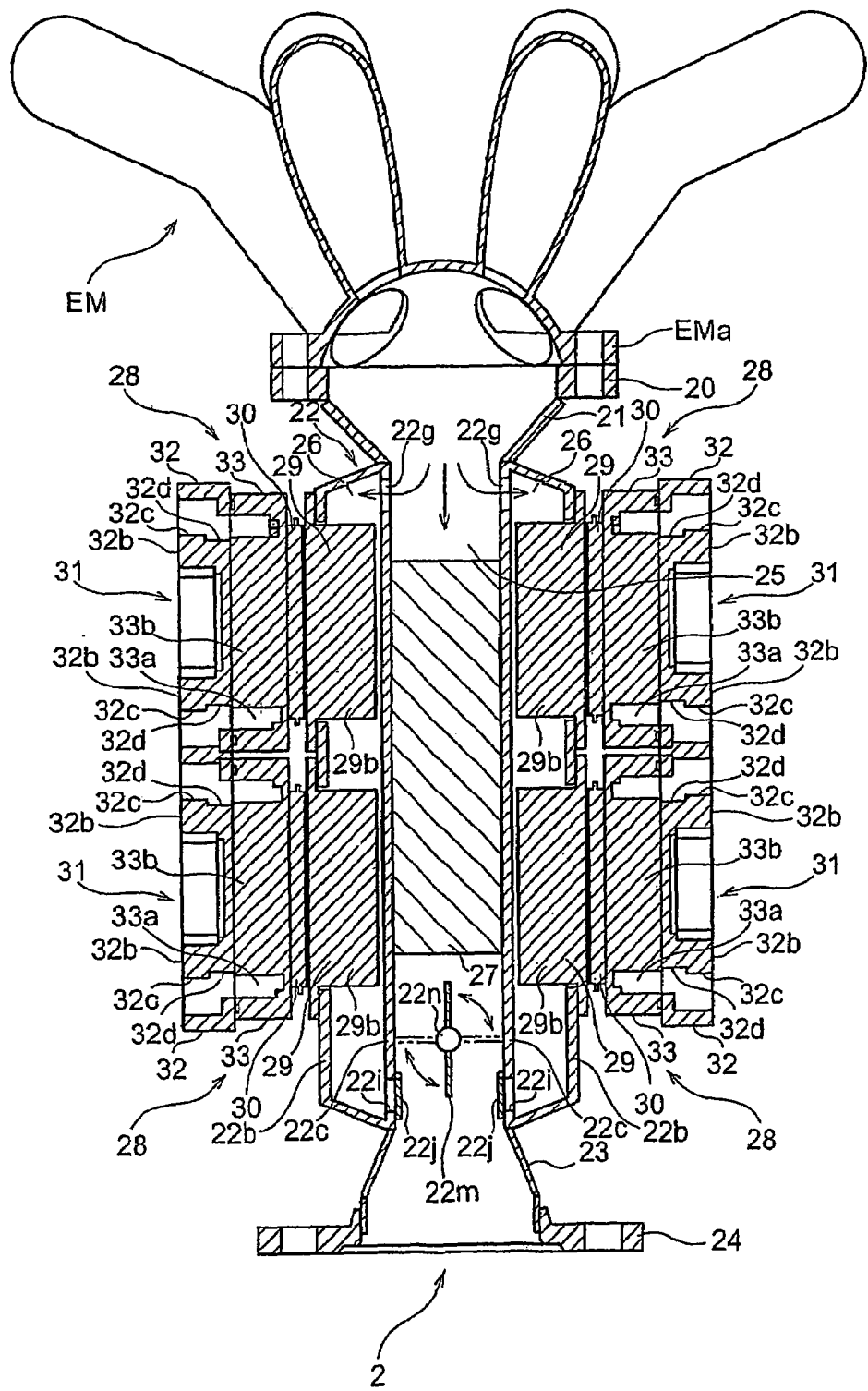
FIG. 4 is a sectional view taken along IV—IV of the side view shown in FIG. 3.
Figure 5:
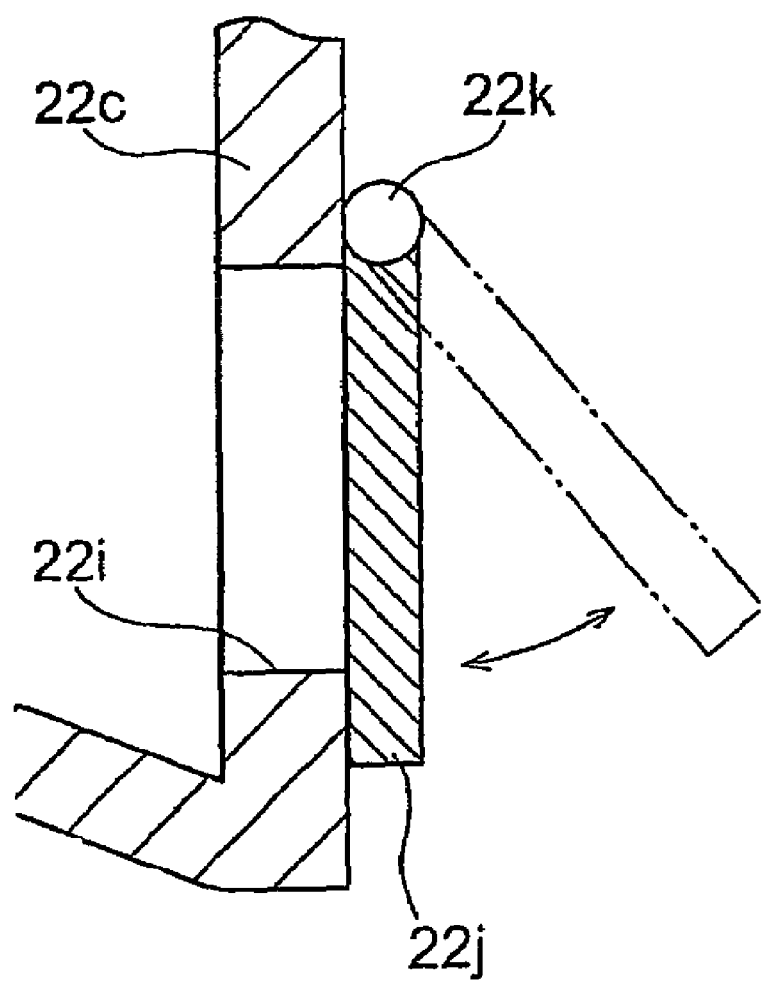
FIG. 5 is an enlarged view of a portion around a discharge opening of a by-pass passage shown in FIG. 4.
Figure 6:
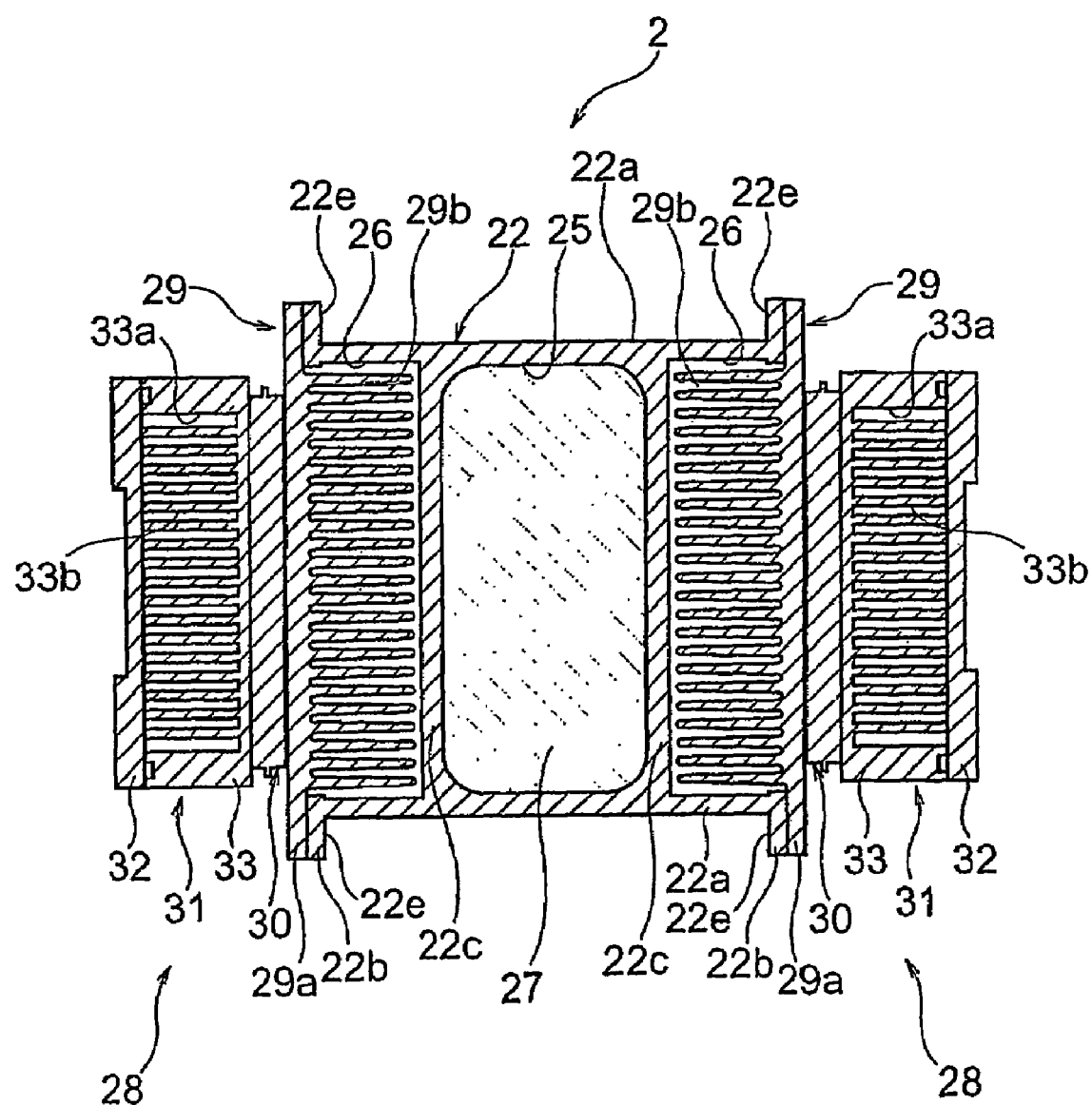
FIG. 6 is a sectional view taken along VI—VI of the side view shown in FIG. 3.

The structure of the upstream catalyst 2 will be described referring to FIGS. 2 to 6. FIG. 2 is an exploded perspective view of a part of the upstream catalyst. FIG. 3 is a side view of the upstream catalyst shown in FIG. 1. FIG. 4 is a sectional view taken along line IV—IV of the side view shown in FIG. 3. FIG. 5 is an enlarged view of a portion around a discharge opening of a by-pass passage shown in FIG. 4. FIG. 6 is a sectional view taken along line VI—VI of the side view shown in FIG. 3.

An inlet 20 of the upstream catalyst 2 at its upstream end is tightened with a discharge port EMa at the downstream end of the exhaust manifold EM using a bolt (not shown). The inlet 20 has the same diameter as that of the discharge port EMa, and its downstream end connected with a taper pipe 21. The taper pipe 21 has a diameter reduced as it goes downstream, and has a downstream end connected with a main body 22 of the upstream catalyst 2. The main body 22 of the upstream catalyst 2 is connected with a taper pipe 23 at its downstream end. The taper pipe 23 has a diameter reduced as it goes downstream. The taper pipe 23 is tightened with a ball joint mechanism at its downstream end with a bolt (not shown).

The main body 22 has a tubular shape extending from the upstream to the downstream, which includes one exhaust passage 25 in the center thereof and two by-pass passages 26 at both sides of the exhaust passage 25 (see FIGS. 4 and 6). An outer periphery of the main body 22 is provided with four walls, that is, two side walls 22a and two outer walls 22b, respectively (see FIG. 6). Inner walls 22c in parallel with the outer wall 22b are provided at a predetermined interval within the main body 22 (see FIG. 6). The exhaust passage 25 is defined by the side walls 22a and the inner walls 22c, having a substantially rectangular shape as a sectional view and extending between the taper pipes 21 and 23. Each of the by-pass passages 26 includes the side walls 22a, outer wall 22b, the inner wall 22c and two heat exchange members 29, having a substantially rectangular shape as a sectional view and placed at the outer side of the exhaust passage 25.

The outer wall 22b is provided with two heat exchange members 29 along its longitudinal direction. Each of two openings 22d is formed at a position where the heat exchange member 29 is provided (see FIG. 2). The opening 22d has a substantially rectangular shape, into which a heat exchange fin 29b of the heat exchange member 29 is inserted (FIGS. 2 and 6). The outer wall 22b has flanges 22e at both outer sides of each of the openings 22d (see FIGS. 2 and 6). The outer wall 22b has a plurality of bolt holes 22f such that the outer periphery of the opening 22d is tightened with the heat exchange member 29 and a cooling unit 31 with bolts 35 (see FIG. 2). Each of the bolt holes 22f is provided with a female thread.

The inner wall 22c has an opening 22g at its most upstream side, and a discharge opening 22i at its most downstream side such that the exhaust passage 25 is communicated with the by-pass passages 26 (see FIG. 4). The by-pass passage 26 admits the exhaust gas from the most upstream portion of the exhaust passage 25 and discharges the exhaust gas into the most downstream portion of the exhaust passage 25. An inner side of the inner wall 22c has a door portion 22j for opening/closing the discharge opening 22i as shown in FIGS. 4 and 5. The door portion 22j has a size sufficient to cover the discharge opening 22i completely when it is closed, and is rotatably fixed at its end at the upstream side with respect to a shaft 22k. The door portion 22j is opened under pressure of the exhaust gas flowing through the by-pass passage 26, and closed under the pressure of the exhaust gas flowing through the exhaust passage 25. The opening of the door portion 22j, thus, is determined depending on the gas pressure (flow rate of the gas) both in the by-pass passage 26 and the exhaust passage 25, respectively.

The pellet-like three-way catalyst is filled in the portion between the opening 22g and the discharge opening 22i each formed in the exhaust passage 25, which constitutes a three-way catalyst 27 for purifying the exhaust gas, as the primary exhaust emission control unit. The exhaust passage 25 includes a valve 22m between the three-way catalyst 27 and the exhaust opening 22i as shown in FIG. 4. The valve 22m has a size (corresponding to the sectional area of the exhaust passage 25) sufficient to cover the exhaust passage 25 completely. Then center of the valve 22m is rotatably fixed with respect to the shaft 22n that is rotated by an actuator (not shown). The actuator is driven in accordance with a rotating driving signal RS from the engine ECU 7 as shown in FIG. 1 so as to rotate the shaft 22n (or the valve 22m). The opening of the valve 22m is controlled by the engine ECU 7. When the valve 22m is operated to be at a right angle to the inner wall 22c, the exhaust passage 25 is completely closed. When the valve 23m is operated to be in parallel with the inner wall 22c (in full communication with the exhaust passage 25), the exhaust passage 25 is completely opened. The valve 22m, shaft 22n, the actuator and the door portion 22j, and the shaft 22k constitute a control member including a passage opening/closing structure.

The engine ECU 7 receives a temperature signal US from the upstream catalyst 2 and a temperature signal DS from the downstream catalyst 3, and sends a driving signal RS to an actuator for rotating the valve 22m (see FIG. 1). The driving signal RS is sent by the engine ECU when the catalytic temperature of the upstream catalyst 2 is lower than a lower limit at the upstream side (the lower limit of the activated temperature of the three-way catalyst: 350° C., for example), and when the catalytic temperature of the upstream catalyst 2 is equal to or higher than the lower limit at the upstream side and the catalytic temperature of the downstream catalyst 3 is lower than the lower limit at the downstream side (the lower limit of the activated temperature of the three-way catalyst: 350° C., for example) so as to open the valve 22m fully. In this case, the valve 22m is opened to open the exhaust passage 25 for admitting the exhaust gas. The pressure of the exhaust gas serves to fully close the door portion 22j so as to close the by-pass passages 26. The flow of the exhaust gas into the by-pass passages 26 is blocked. When the catalytic temperature of the downstream catalyst 3 is equal to or higher than the lower limit at the downstream side or higher, the driving signal RS is sent by the engine ECU 27. In this case. The valve 22m is fully closed to close the exhaust passage 25. Accordingly, the exhaust gas does not flow into the exhaust passage 25. The door portion 22j is fully opened under the pressure of the exhaust gas flowing through the by-pass passages 26 so as to be opened. The exhaust gas, thus, is allowed to flow through the by-pass passages 26. The driving signal RS for fully closing the valve 22m may be sent from the engine ECU 7 when the catalytic temperature of the upstream catalyst 2 becomes higher than the upper limit at the upstream side (upper limit of the activated temperature of the three-way catalyst: 800° C., for example).

Each of four exhaust heat power generation units 28 is fit in each of the openings 22d formed in the main body 22 of the upstream catalyst 2. The exhaust heat power generation unit 28 is structured based on a thermoelectric converting module 30. Each of the elements for constituting the unit 28 is structured based on the size of the thermoelectric converting module 30. The exhaust heat power generation unit 28 applies appropriate pressures (17 kg/cm$^2$) to the thermoelectric power generation unit 28 from the low temperature side and the high temperature side, thus improving the thermoelectric conversion efficiency. The exhaust heat power generation unit 28 is provided with a heat exchange member 29, the thermoelectric converting module 30 as the thermoelectric converting element, and a cooling unit 31.

The heat exchange member 29 is mainly formed of a base 29a and a heat exchange fin 29b as shown in FIG. 6. The base 29a has a thick plate-like shape, and one flat surface which is in tight contact with a high temperature end surface of the thermoelectric converting module 30. The outer periphery of the base 29a has bolt holes 29c with which each bolt 35 is fit for tightening the heat exchange member 29 with the main body 22 in engagement with the outer wall 22b (flange portion 22e) as shown in FIG. 2. The other surface of the base 29a has the heat exchange fin 29b attached thereto. The height of each fin of the heat exchange fin 29b is set such that it is not in contact with the inner wall 22c of the main body 22 to which the heat exchange member 29 is attached as shown in FIG. 4. The surface area of the heat exchange fin 29b of the heat exchange member 29 is enlarged to increase the area of the portion in contact with the exhaust gas such that more thermal energy of the exhaust gas is absorbed. Each of the heat exchange members 29 is fit with the corresponding opening 22d formed in the main body 22 so as to be tightened together with each of the cooling units 31 using the respective bolts 35 (see FIG. 2). This makes it possible to form each of the by-pass passages 26 (see FIG. 4).

The pellet-like three-way catalyst that is identical to the three-way catalyst 27 may be burned into the surface of each fin of the heat exchange fin 29b so as to be carried on the heat exchange member 29. The aforementioned structure makes it possible to purify the exhaust gas flowing through the by-pass passage 26 while converting the thermal energy into electric energy. In this case, the heat exchange fin 29b is capable of absorbing the thermal energy resulting from the reaction heat caused by the three-way catalyst as well as the thermal energy of the exhaust gas. This makes it possible to improve the thermoelectric conversion efficiency of the exhaust heat power generation unit 28.

The thermoelectric converting module 30 includes a plurality of thermoelectric elements (not shown), for example, semiconductors of p type and n type formed of $Bi_2Te_3$ which are arranged in series electrically and in parallel thermally. The thermoelectric converting module 30 has a substantially square shape with small area, having a high temperature end surface and a low temperature end surface horizontally arranged in parallel with each other. The thermoelectric converting module 30 serves to convert the thermal energy into the electric energy using the temperature difference between both end surfaces based on Seebeck effect such that electric energy is output from two electrodes (not shown).

The cooling unit 31 serves to apply appropriate pressure to a low temperature end surface of the thermoelectric converting module 30 so as to be fixed and cooled with water. The cooling unit 31 is provided with a lid 32, a main body 33 and cooling water pipes 34.

The lid 32 for the main body 33 has a thick plate portion 32a with the same dimension as that of the main body 33 (see FIGS. 2 and 3). The plate portion 32a has mount portions 32b at both sides on which the cooling water pipes 34 are attached (see FIGS. 2 and 3). Each of the mount portions 32b has a mounting hole 32c with which the cooling water pipe 34 is fit and a cooling water hole 32d connected to the lower side of the mounting hole 32c (see FIG. 4). Each of the cooling water holes 32d pierces to the bottom face of the lid 32 so as to be connected with a cooling portion 33a. Bolt holes (not shown) are formed in each corner of the plate portion 32a, through which the main body 33 and the heat exchange member 29 are attached to the main body 22 (see FIG. 2) with the respective bolts 35.

The main body 33 is formed into a thick box like shape to be closed with the lid 32, which has a dimension slightly longer than that of the thermoelectric converting module 30. A recess portion of the main body 33 constitutes the cooling portion 33a into which the cooling water flows (see FIG. 6). The cooling portion 33a is provided with a cooling fin 33b for cooling the cooling water. Each fin of the cooling fin 33b has the same height so as to be in contact with the bottom of the lid 32 when being set onto the main body 33. The bottom surface of the main body 33 is flat so as to be in tight contact with the low temperature end surface of the thermoelectric converting module 30. Bolt holes (not shown) are formed in each corner of the main body 33 through which the lid 32 and the heat exchange member 29 are attached to the main body 22, and then tightened with bolts 35 (see FIG. 2).

The lid 32 is set to be fixed on the main body 33 by tightening with four bolts 35 (see FIG. 2), and two cooling water pipes 34 are attached to the lid 32 by welding to form the cooling unit 31. The cooling unit 31 is further fixed to the body 22 via the thermoelectric converting member 29 with four bolts 35. The use of those bolts 35 makes it possible to interpose the thermoelectric converting module 30 between the cooling unit 31 and the heat exchange member 29 under the appropriate surface pressure.

The upstream catalyst 2 is provided with two cooling units 31 arranged in the longitudinal direction. The cooling water pipe 34 upstream of the cooling unit 31 at the upstream side and the cooling water pipe 34 downstream of the cooling unit 31 at the downstream side are connected to a radiator (not shown) via a radiator hose (not shown), and the other cooling water pipes 34 are connected with each other (see FIG. 2). In the cooling unit 31, the cooling water cooled by the radiator is admitted into the cooling portion 33a through the cooling water pipe 34 and the cooling water hole 32d. The cooling water then flows through fins of the cooling fin 33b so as to cool the thermoelectric converting module 30, keeping the low temperature (see FIG. 4).

An operation of the exhaust system 1 will be described referring to FIGS. 1 to 6. Each operation of the exhaust system 1 will be described in the case where:

(1) the catalytic temperature in the upstream catalyst 2 is lower than the lower limit at the upstream side;

(2) the catalytic temperature in the upstream catalyst 2 is equal to or higher than the lower limit at the upstream side, and the catalytic temperature in the downstream catalyst 3 is lower than the lower limit at the downstream side; and (3) the catalytic temperature in the downstream catalyst 3 is equal to or higher than the lower limit at the downstream side.

(1) The operation of the exhaust system 1 will be described in the case where the catalytic temperature in the upstream catalyst 2 is lower than the lower limit at the downstream side. Upon start-up of the engine, the exhaust gas is discharged from each cylinder of the engine. The exhaust gas is admitted by the upstream catalyst 2 via the exhaust manifold EM. In the upstream catalyst 2, the exhaust gas flows into the exhaust passage 25 passing through the three-way catalyst 27.

As the temperature of the exhaust system as a whole is low at the start-up of the engine, the catalytic temperature of the three-way catalyst 27 is lower than the lower limit at the upstream side, that is, the catalytic temperature has not reached the activated temperature yet. The engine ECU 7 sends the driving signal RS for fully opening the valve 22*m* to the actuator based on the temperature signal US from the upstream catalyst 2. Then the actuator rotates the shaft 22*n* to fully open the valve 22*m*. When the valve 22*m* is fully opened, the exhaust passage 25 is opened to allow the exhaust gas to flow therethrough. The resultant pressure of the exhaust gas brings the door portion 22*j* into a fully closed state to close the by-pass passages 26, interrupting the flow of the exhaust gas thereinto. Therefore, each of the exhaust heat power generation unit 28 does not generate power using the exhaust heat. At this moment, the cooling water is not circulated in the cooling unit 31 of the exhaust heat power generation unit 28.

After passing through the upstream catalyst 2, the exhaust gas is admitted by the downstream catalyst 3. When the exhaust gas is admitted by the downstream catalyst 3 to pass through the three-way catalyst, the catalytic temperature is lower than the lower limit at the downstream side, that is, the catalytic temperature has not reached the activated temperature yet.

After passing through the downstream catalyst 3, the exhaust gas flows through the sub muffler 4 and the main muffler 5 where the noise caused by the flow of the exhaust gas is eliminated. The exhaust gas having its noise eliminated is then discharged into atmosphere.

In this case, as the by-pass passages 26 are closed, the thermal energy of the exhaust gas can be used only for increasing the temperature of the three-way catalyst without being consumed by the exhaust eat power generation units 28. As a result, the catalytic temperature of the three-way catalyst 27 may be rapidly increased as the rise in the exhaust gas temperature.

(2) The operation of the exhaust system 1 will be described in the case where the catalytic temperature in the upstream catalyst 2 is equal to or higher than the lower limit at the upstream side and the catalytic temperature in the downstream catalyst 3 is lower than the lower limit at the downstream side. After start-up of the engine, the temperature of the exhaust system as a whole is gradually increased. The exhaust gas is admitted by the upstream catalyst 2 via the exhaust manifold EM. The exhaust gas then flows into the exhaust passage 25 of the upstream catalyst 2 passing through the three-way catalyst 27. As the upstream catalyst 2 is placed in the vicinity of the exhaust manifold EM, the exhaust gas may flow into the exhaust passage 25 while being held at the high temperature. Accordingly the catalytic temperature of the three-way catalyst 27 sharply rises, reaching the activated temperature within a considerably short period. Subsequent to the moment when the catalytic temperature reaches the activated temperature, the three-way catalyst 27 starts purifying the exhaust gas, At this time, the catalytic temperature of the three-way catalyst 27 becomes equal to or higher than the lower limit at the upstream side.

After passing through the upstream catalyst 2, the exhaust gas has its thermal energy consumed to heat the three-way catalyst 27. The exhaust gas at the decreased temperature is admitted by the downstream catalyst 3. The exhaust gas is admitted to pass through the three-way catalyst in the downstream catalyst 3. The catalytic temperature of the downstream catalyst 3 is gradually increased, but is lower than the lower limit at the downstream side, that is, the catalytic temperature has not reached the activated temperature. The engine ECU 7 sends the driving signal RS for fully opening the valve 22*m* to the actuator based on the temperature signal US from the upstream catalyst 2 and the temperature signal DR from the downstream catalyst 3. As the valve 22*m* is in the fully opened state, the exhaust passage 25 is opened. As the door portion 22*j* is in the fully closed state, the by-pass passages 26 are closed. In the aforementioned case, the engine ECU 7 may be structured to send the driving signal RS to the actuator so as to gradually reducing the opening of the valve 22*m* in accordance with the catalytic temperature either of the upstream catalyst 2 or the downstream catalyst 3. This may allow the exhaust gas to gradually increase the flow rate of the exhaust gas flowing into the by-pass passages 26. As a result, power is generated by the exhaust heat power generation units 28, and excessive rise in the catalytic temperature of the upstream catalyst 2 may be prevented.

After passing through the downstream catalyst 3, the exhaust gas flows into the sub muffler 4 and the main muffler 5 where the noise caused by the flow of the exhaust gas is eliminated. The exhaust gas having been purified and noise muffled is discharged into atmosphere.

In the aforementioned case, although the catalytic temperature in the downstream catalyst 3 has not reached the activated temperature, the upstream catalyst 2 has purified the exhaust gas to a certain extent. As the by-pass passages 26 are closed, the thermal energy of the exhaust gas may be used only for heating the three-way catalyst in both the upstream catalyst 2 and the downstream catalyst 3 without being consumed by the exhaust heat power generation units 28. This makes it possible to increase the catalytic temperature in the downstream catalyst 3 rapidly as the rise in the exhaust gas temperature. If the downstream catalyst 3 exhibits the purifying capability partially, it is capable of purifying the exhaust gas that has passed through the by-pass passages 26 each in partly opened state.

(3) The operation of the exhaust system 1 will be described in the case where the catalytic temperature in the upstream catalyst 3 is equal to or higher than the lower limit at the downstream side. In the high load of the engine (at high engine speed), the exhaust gas at the high temperature is admitted by the upstream catalyst 2 and the downstream catalyst 3. Each of the catalytic temperature in the upstream and the downstream catalysts 2 and 3 has reached the activated temperature.

The catalytic temperature in the downstream catalyst 3 becomes equal to or higher than the lower limit at the downstream side, that is, the catalytic temperature has reached the activated temperature. The engine ECU 7 sends the driving signal RS to the actuator for fully closing the valve 22*m* based on the temperature signal DS from the downstream catalyst 3. In response to receipt of the driving signal RS, the actuator rotates the shaft 22*n* such that the valve 22*m* is fully closed. When the valve 22*m* is fully closed, the exhaust passage 25 is closed. At this moment, as the flow of the exhaust gas into the exhaust passage 25 is interrupted, the three-way catalyst 27 does not purify the exhaust gas.

When the exhaust gas flows into the by-pass passages 26, the door portion 22*j* is brought into the fully closed state under the pressure of the exhaust gas to open the by-pass passages 26 so as to allow the flow of the exhaust gas. In each of the exhaust heat power generation units 28, the thermal energy of the exhaust gas flowing through the by-pass passage is absorbed in fins of the heat exchange fin 29*b* of the heat exchange member 29. The high temperature is then transferred to the high temperature end surface of the thermoelectric converting module 30. In each of the exhaust heat power generation units 28, the cooling water is circulated in the cooling unit 31 such that the low temperature is transferred to the low temperature end surface of the thermoelectric converting module 30. Finally the exhaust heat power generation units 28 serve to generate power in accordance with the difference in the high temperature and the low temperature in the thermoelectric converting module 30. The generated power is then charged in the battery.

In the case where the three-way catalyst is carried on the heat exchange fin 29*b*, the exhaust gas flowing through the by-pass passages 26 is purified by the three-way catalyst. The reaction heat caused by the three-way catalyst is absorbed by the heat exchange fin 29*b*.

After passing through the upstream catalyst 2, the exhaust gas is admitted by the downstream catalyst 3. As the catalytic temperature in the downstream catalyst 3 has reached the activated temperature, the exhaust gas can be purified thereby. The exhaust gas that has passed through the downstream catalyst 3 is admitted by the sub muffler 4 and the main muffler 5 where the noise of the exhaust gas is eliminated. The exhaust gas that has been purified and noise muffled is discharged into atmosphere.

As the catalytic temperature in the downstream catalyst 3 has reached the activated temperature, the exhaust gas can be purified. The by-pass passages 26 are opened such that the thermal energy of the exhaust gas is collected through power generation performed by the exhaust heat power generation units 28 without being consumed for increasing the catalytic temperature of the three-way catalyst 27 in the upstream catalyst 2. As a result, the catalytic temperature of the three-way catalyst 27 is not increased, preventing the catalytic temperature from exceeding the upper limit of the activated temperature.

In the exhaust system 1, the upstream catalyst 2 is placed in the vicinity of the exhaust manifold EM, having the exhaust passage 25 filled with the three-way catalyst in the center thereof. The exhaust gas exhibiting the highest thermal energy among the elements constituting the exhaust system 1 is admitted by the three-way catalyst 27. This makes it possible to raise the catalytic temperature to the activated temperature rapidly even if it is lower than the activated temperature. The exhaust system 1 includes by-pass passages 26 each provided at both sides of the exhaust passage 25. The aforementioned by-pass passages 26 provide the heat retention and thermal insulation functions, thus further enhancing the temperature increasing effect of the three-way catalyst 27.

The exhaust system 1 is provided with the exhaust heat power generation units 28 for collecting the thermal energy of the exhaust gas flowing through the by-pass passages 26 in addition to the exhaust passage 25 in the upstream catalyst 2. In the case where the exhaust gas is not required for heating the three-way catalyst 27, the exhaust gas is admitted into the by-pass passages 26 so as to be used for collecting the thermal energy of the exhaust gas. In the exhaust system 1, as the upstream catalyst 2 is placed in the vicinity of the exhaust manifold EM, the electric energy can be efficiently collected from the exhaust gas exhibiting the highest thermal energy. As the exhaust system 1 is provided with the downstream catalyst 3, the flow of the exhaust gas into the exhaust passage 25 in the upstream catalyst 2 can be interrupted when the catalytic temperature of the downstream catalyst 3 reaches the activated temperature. This makes it possible to prevent the catalytic temperature in the upstream catalyst 2 from increasing in excess of the activated temperature, avoiding degradation of the three-way catalyst. There is no needs of operating the engine in a fuel-rich state for reducing the catalytic temperature in the upstream catalyst 2. This may prevent the fuel from being excessively consumed yet collecting the high thermal energy as electric energy, resulting in improved fuel efficiency. As the three-way catalyst is unlikely to be degraded, the amount of the three-way catalyst can be reduced, thus making each of the upstream and the downstream catalysts 2, 3 into compact.

The exhaust system 1 is allowed to control the flow rate of the exhaust gas passing through each of the exhaust passage 25 and the by-pass passages 26, respectively in accordance with the respective catalytic temperatures in the upstream and the downstream catalysts 2, 3. This makes it possible to allow both the three-way catalyst 27 and the exhaust heat power generation units 28 to be operated in the vicinity of the exhaust manifold EM, resulting in efficient use of the thermal energy of the exhaust gas.

In the exhaust system 1 having the three-way catalyst carried on the heat exchange fin 29*b*, the catalytic effect may be enhanced and the effect for absorbing the thermal energy resulting from the reaction heat of the three-way catalyst may be improved. In this case, the exhaust gas that has escaped into the by-pass passages 26 can be reliably purified. Accordingly, the exhaust system 1 is capable of performing its function sufficiently even if the downstream catalyst 3 is not provided.

In the exhaust system 1, the noise caused by the flow of the exhaust gas can be reduced, thus reducing each size of the sub muffler 4 and the main muffler 5. The exhaust system 1 is capable of performing its function sufficiently without the sub muffler 4. The exhaust system 1 exhibits excellent efficiency for collecting the thermal energy of the exhaust gas, which may reduce the temperature and the volume of the exhaust heat. The resultant decrease in the flow rate of the gas may allow the resistance against the exhaust gas pressure to be decreased, increasing the engine outputs.

Figure 7:
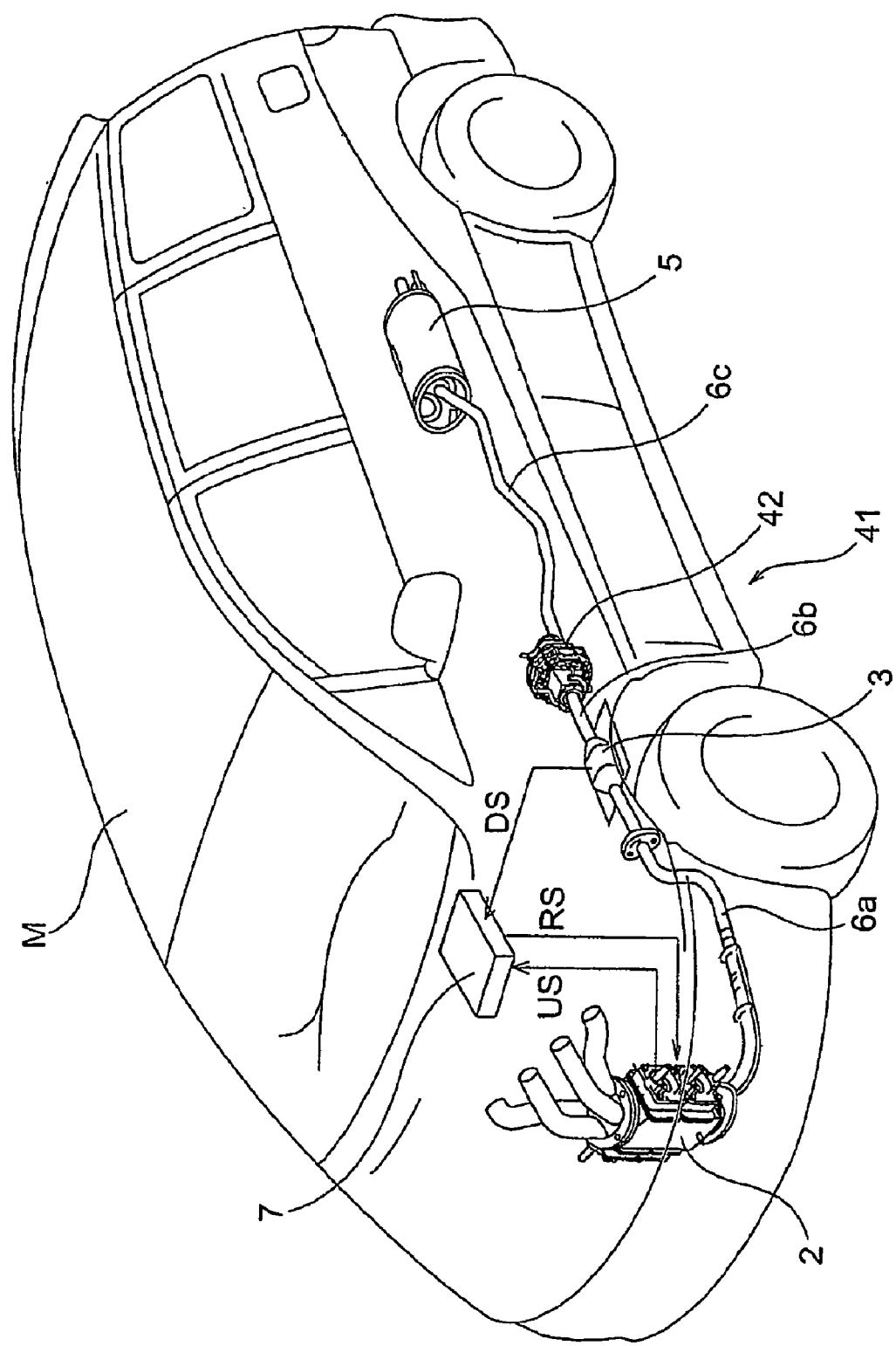
FIG. 7 is a schematic overall view of an exhaust system according to a second embodiment of the invention.

A structure of an exhaust system 41 according to another embodiment will be described referring to FIG. 7. FIG. 7 is a schematic view of the exhaust system according to this embodiment. The elements constituting the exhaust system 41 identical to those of the exhaust system 1 are designated with the same reference numerals in the previous embodiment, and each description thereof, thus, is omitted.

The structure of the exhaust system 41 is the same as that of the exhaust system 1 except that an exhaust heat power generation apparatus 42, as a second exhaust heat collecting unit, is provided in place of the sub muffler 4 (see FIG. 1). As has been already described in the previous embodiment, the noise produced by the exhaust system according to this embodiment is smaller than that produced by the generally employed exhaust system. In this embodiment, the exhaust system 41 is provided with an exhaust heat power generating apparatus 42 that functions as a sub muffler so as to improve the efficiency for collecting the thermal energy of the exhaust gas as electric energy. The exhaust system 41 is mainly formed of the upstream catalyst 2, the downstream catalyst 3, the exhaust heat power generation apparatus 42, and the main muffler 5. The exhaust heat power generation apparatus 42 is placed at the position where the sub muffler 4 of the exhaust system 1 is provided. Exhaust pipes 6*b* and 6c are connected to the upstream end and the downstream end of the exhaust heat power generation apparatus 42, respectively.

The exhaust heat power generation apparatus 42 converts the thermal energy of the exhaust gas that has not been collected by the upstream catalyst 2 into electric energy. The resultant electric energy is charged in the battery via the DC/DC converter.

Figure 8:
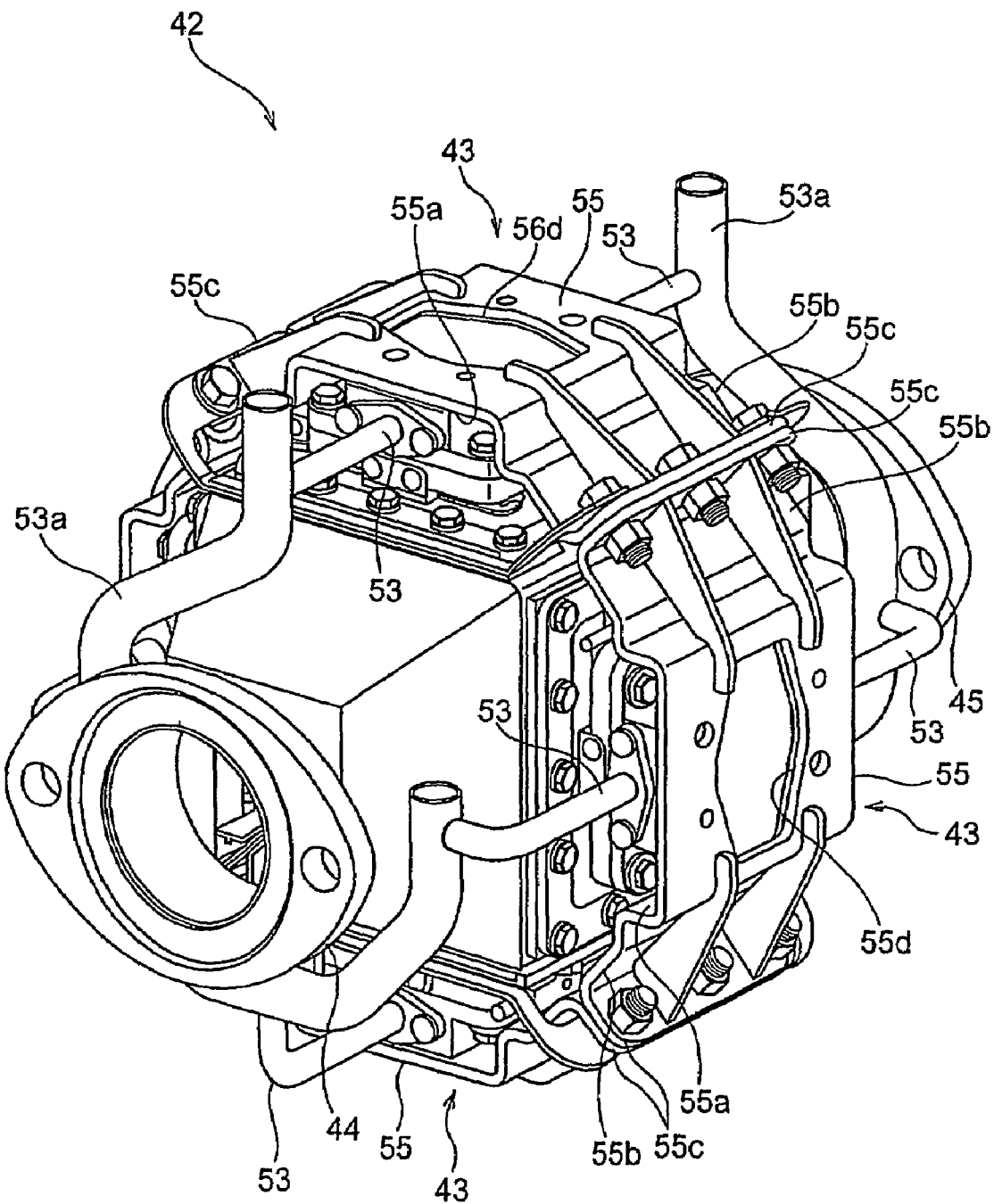
FIG. 8 is perspective view of an exhaust heat power generation apparatus shown in FIG. 7.
Figure 9:
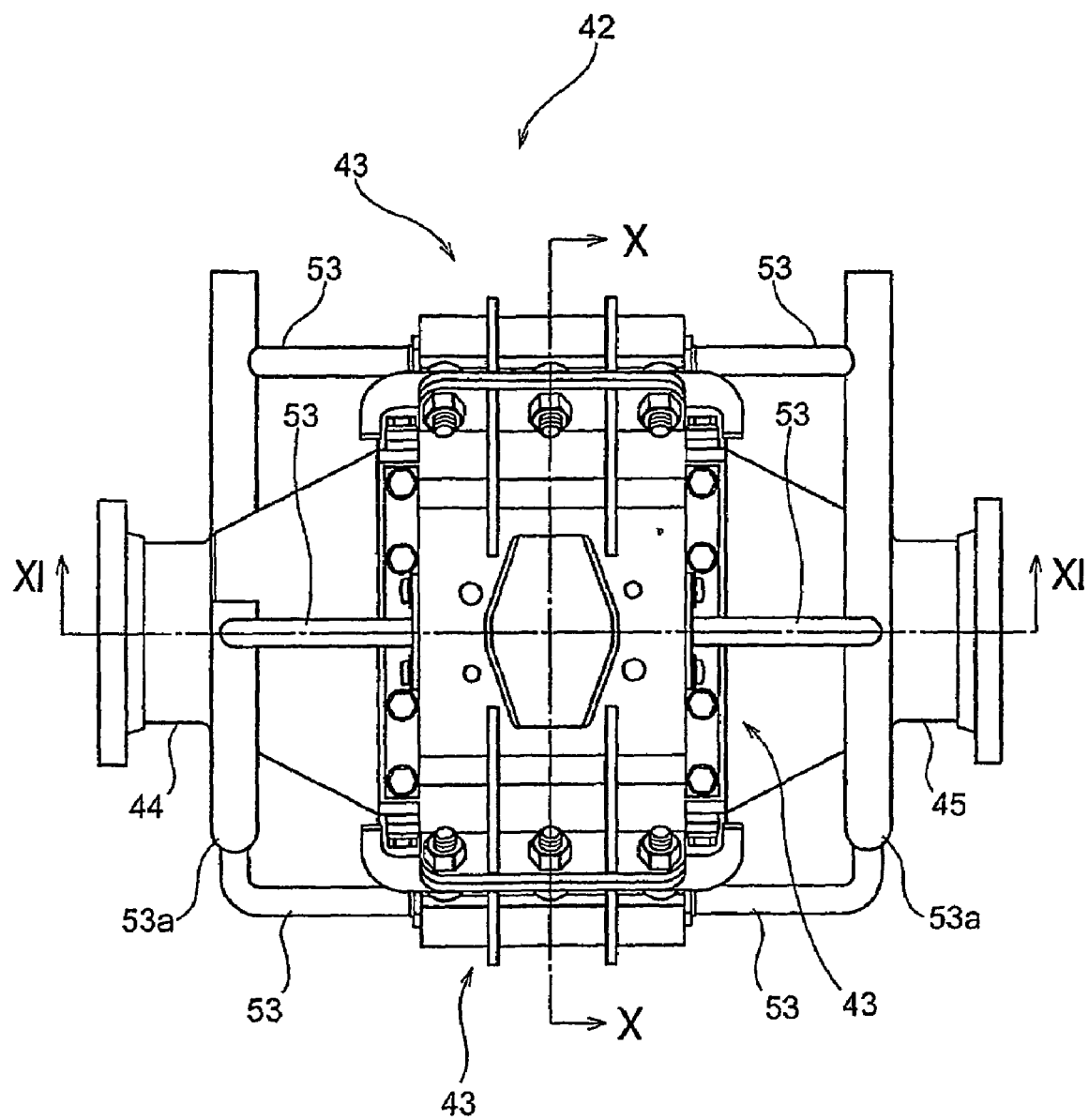
FIG. 9 is a front view of the exhaust heat power generation apparatus.
Figure 10:
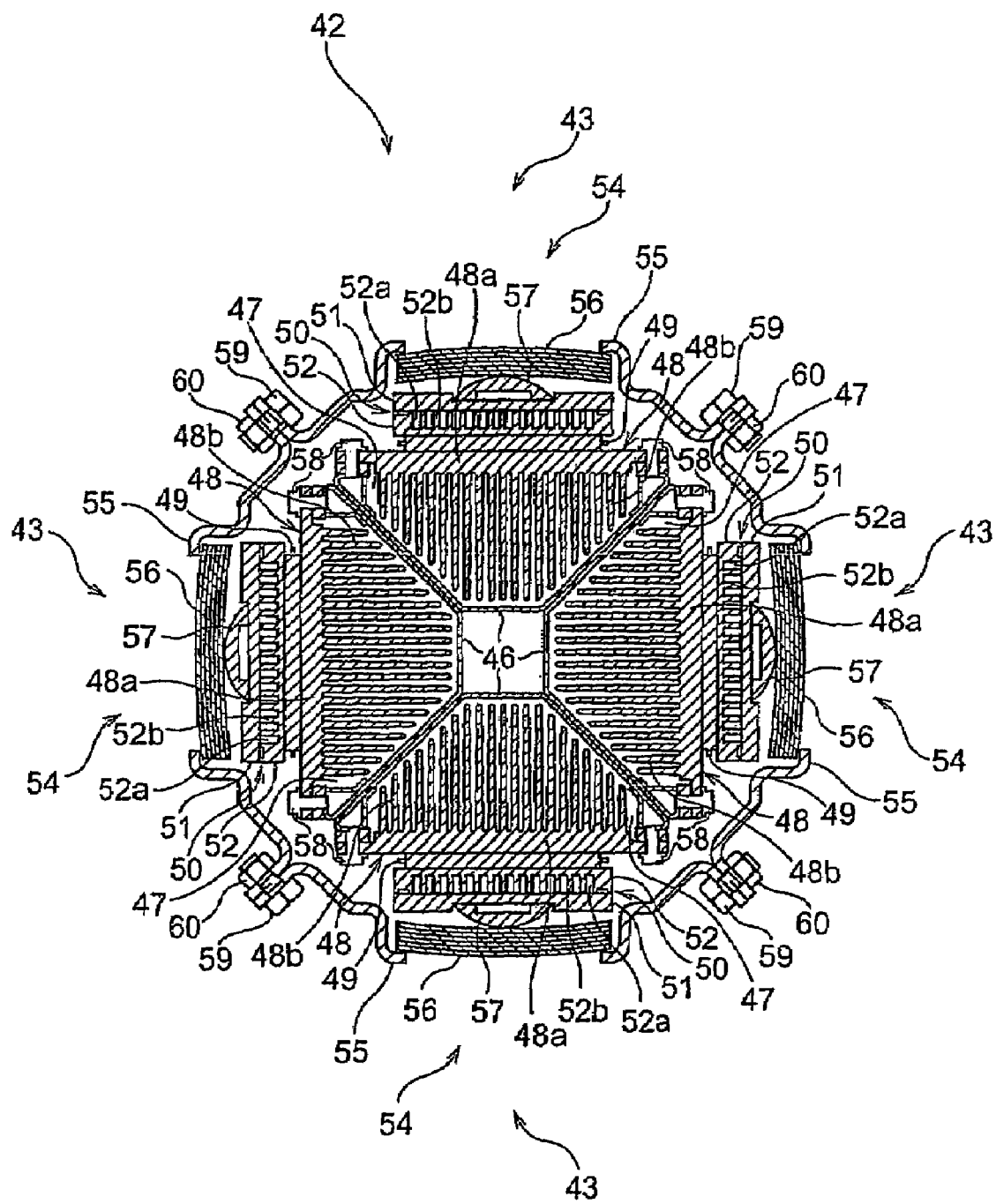
FIG. 10 is a sectional view taken along X—X of the front view shown in FIG. 9.
Figure 11:
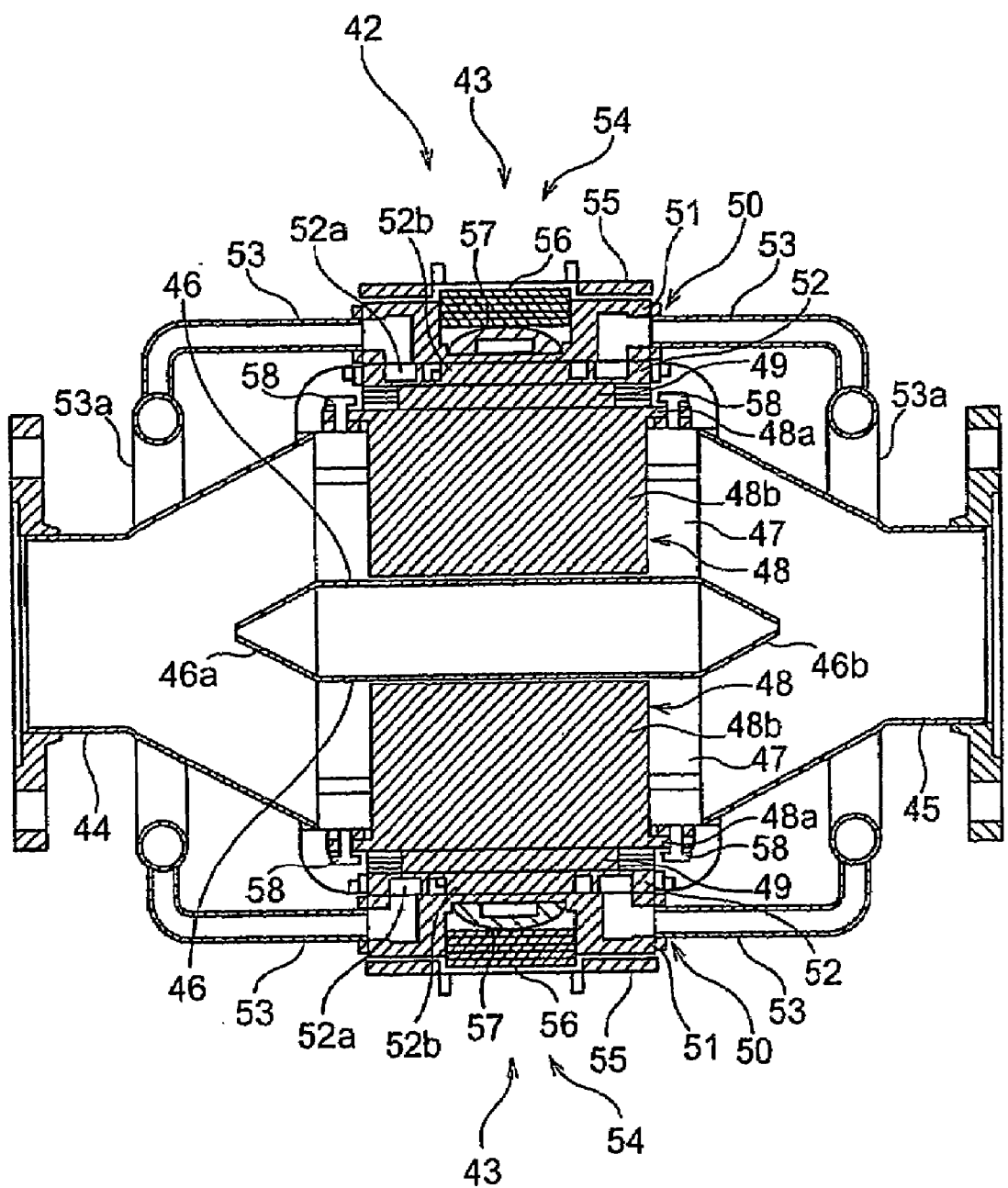
FIG. 11 is a sectional view taken along XI—XI of the front view shown in FIG. 9.

The structure of the exhaust heat power generation apparatus 42 will be described referring to FIGS. 8 to 11. FIG. 8 is a perspective view of the exhaust heat power generation apparatus. FIG. 9 is a front view of the exhaust heat power generation apparatus shown in FIG. 7. FIG. 10 is a sectional view taken along line X—X of the front view shown in FIG. 9. FIG. 11 is a sectional view taken along line XI—XI of the front view shown in FIG. 9.

The exhaust heat power generation apparatus 42 has an exhaust pipe of tetrameric type (divided into four parts along the periphery). There are four exhaust heat power generation units 43 arranged along the periphery (see FIG. 10). Each exhaust heat power generation units 43 in the exhaust heat power generation apparatus 42 serves to convert the thermal energy of the exhaust gas into electric energy.

In the exhaust heat power generation apparatus 42, an exhaust introduction pipe 44 connected to the exhaust pipe 6b at upstream side is provided at an end of the upstream side, and an exhaust discharge pipe 45 connected to an exhaust pipe at downstream side is provided at an end of the downstream side. There are four divided exhaust pipes 46 which are connected with one another through welding between the exhaust introduction pipe 44 and the exhaust discharge pipe 45. Each of those divided exhaust pipes 46 is arranged at every 90° at the center of the exhaust heat power generation apparatus 42, forming each frame of four divided exhaust passages 47, respectively (see FIG. 10).

The divided exhaust pipe 46 has a main portion of a thin plate-like shape, and an isosceles trapezoidal shape as a side view (see FIG. 10). Each angle defined by the long side and two sides each connecting between the respective ends of the long side and the short side is 45°. An outer plate corresponding to the long side of the divided exhaust pipe 46 is provided with openings. Each of the openings has a substantially square shape, to which a heat exchange fin 48b of the heat exchange member 48 is inserted. The outer plate has bolt holes formed therein through which the heat exchange member 48 is tightened with a bolt along the outer periphery of the opening.

Side plates of each of the divided exhaust pipes 46 are welded to the respective side plates of adjacent divided exhaust pipes each arranged at 90°. Then four divided exhaust pipes 46 are connected along the periphery and formed into a substantially square shape as the side view (see FIG. 10). Each of the divided exhaust pipes 46 is provided with heat exchange member 48. A divided exhaust passage 47 is formed by closing the opening. Both ends of each of inner plates of four divided exhaust pipes 46 are connected to a split member 46b at an upstream side through welding, and a joint member 46b at a downstream side through welding (see FIG. 11). The split member 46a is formed like a quadrangular pyramid shape having its width reduced as it goes upstream such that the flow of the exhaust gas from the exhaust introduction pipe 6b is split into four divided exhaust passages 47. The joint member 46b is formed like a quadrangular pyramid shape having its width reduced as it goes downstream such that the exhaust gas each flowing through four divided exhaust passages 47 is joined together.

The exhaust heat power generation unit 43 is mainly formed of a thermoelectric converting module 49. Various elements that constitute the unit 43 are formed based on the size of the thermoelectric converting module 49. In the exhaust heat power generation unit 43, appropriate pressure (for example, 17 kg/cm$^2$) is applied to the thermoelectric converting module 49 from the low temperature side and the high temperature side. The exhaust heat power generation unit 43 is flexibly compressed by the spring system so as to improve the thermoelectric conversion efficiency of the thermoelectric converting module 49. Then each of the exhaust heat power generation unit 43 is fit in the opening of the divided exhaust pipe 46, respectively. The exhaust heat power generation unit 43 is provided with the heat exchange member 48, the thermoelectric converting module 49, a cooling unit 50, and a spring clamp 54.

The heat exchange member 48 is mainly formed of a base 48a and a heat exchange fin 48b. The base 48a has a dimension longer than that of the thermoelectric converting module 49 both in the width and longitudinal directions. The upper surface of the base 48a has a flat face so as to be brought into tight contact with the high temperature end surface of the thermoelectric converting module 49. The outer peripheral portion of the base 48a has a plurality of holes formed therein, through which the divided exhaust pipe 46 is fixed and tightened with bolts. The heat exchange fin 48b attached to the base 48a has a height such that each fin of the heat exchange fin 48b becomes close to the side plates and the inner plates of the divided exhaust pipe 46 but not in contact therewith when the heat exchange member 48 is attached to the divided exhaust pipe 46. Therefore all the fins of the heat exchange fin 48b form substantially isosceles trapezoidal shape as shown in FIG. 10. The heat exchange member 48 is fit into the opening of the divided exhaust pipe 46 and tightened with bolts 58 so as to form the divided exhaust passage 47 (see FIGS. 10, 11). The height of each fin of the heat exchange fin 48b may be set so as to be in contact with the side plate and inner plate of the divided exhaust pipe 46. In this case, however, each of the fins or the divided exhaust pipe 46 has to be formed to be sufficiently deformed, and have the exhaust gas absorbing action.

The thermoelectric converting module 49 is identical to the thermoelectric converting module 30 as described in the previous embodiment.

The cooling unit 50 serves to apply appropriate pressure to a low temperature end surface of the thermoelectric converting module 49 so as to be fixed and cooled with water. The cooling unit 50 is provided with a lid 51, a main body 52 and cooling water pipes 53.

The lid 51 for the main body 52 has a plate portion. A circular bottomed hole is formed in the center of the plate portion so as to receive a compression member 57 to be fit therein. Support portions 9 are provided at both sides of the hole, each of which serves to support leaf springs 56 from both sides and to place cooling water pipes 53. Fitting holes are formed in the outer side of the respective support portions such that the respective cooling water pipes 53 are fit therein. Cooling water holes are further formed in the support portions, each communicated with lower side portion of the fitting holes, respectively. The cooling water holes pierce through the bottom of the lid 51 so as to be communicated with a cooling portion 52 of the main body 52 (see FIG. 11). Holes are formed at each corner of the plate portion through which the main body 52 is tightened with bolts.

The main body 52 has a box-like shape with large thickness. A recess portion of the main body 52 constitutes a cooling portion 52 into which the cooling water flows (FIG. 11). The cooling portion 52a is provided with a cooling fin 52b for cooling the cooling water. Each fin of the cooling fin 52b has the same height so as to be in contact with the bottom of the lid 51 when being set onto the main body 52. The bottom surface of the main body 52 is flat so as to be in tight contact with the low temperature end surface of the thermoelectric converting module 49. Bolt holes are formed in each corner of the main body 52 through which the lid 51 is tightened with the bolt.

The lid 51 is set to be fixed on the main body 52 by tightening four bolts (not shown), and two cooling water pipes 53 are attached to the lid 51 by welding to form the cooling unit 50. The exhaust heat power generation apparatus 42 has four cooling units 50 arranged in the peripheral direction (see FIG. 10). The two cooling water pipes 53 respectively attached to the adjacent cooling units 50 are connected to a radiator (not shown) via a radiator hose (not shown). The other cooling water pipes 53 are connected via a connecting pipe 53 between the adjacent cooling units 50 (see FIG. 8). In each of the cooling units 50, the cooling water that has been cooled by the radiator is admitted into the cooling portion 52a through the cooling water pipe 53 and the cooling water hole, and further allowed to pass through fins of the cooling fin 52b. The thermoelectric converting module 49 is cooled, and the low temperature, thus, can be kept.

The spring clamp 54 serves to apply a predetermined pressure to the thermoelectric converting module 49 from the outside of the cooling unit 50 so as to be fixed between the cooling unit 50 and the heat exchange member 48. At this time, the spring clamp 54 flexibly compresses the exhaust heat power generation unit 43 as a whole with the elastic force derived from a plurality of leaf springs. Four spring clamps 54 are fastened to the exhaust heat power generation apparatus 42 along its periphery so as to be tightened. The spring clamp 54, therefore, includes a clamp 55, a plurality of leaf springs 56, and the compression member 57.

The clamp 55 includes a storage portion 55a, connecting portions 55b, fastening portions 55c (see FIG. 8). The storage portion 55a, connecting portions 55b and the fastening portions 55c are all formed from a single plate. The storage portion 55a has a recess portion when viewed in front. An opening 55d that has the same shape but slightly smaller size than those of the leaf springs 56 is formed in the center of the storage portion 55a (FIG. 8). The outer periphery of the opening 55d serves to compress the leaf spring 56. The connecting portions 55b serve to connect the storage portion 55a to the fastening portions 55c at both ends. The fastening portion 55c is formed by bending both ends of the plate that constitutes the clamp 55 at right angles with respect to the connecting portions 55b so as to be in contact with the adjacent bottom surface of the clamp 55. Three bolt holes through which bolts pierce are formed in each of the fastening portions 55c. When four clamps 15 are connected and fastened, they form a substantially circular shape as a sectional view, covering the outermost portion of the exhaust heat power generation apparatus 42 (see FIG. 10).

The leaf spring 56 has a substantially ellipsoidal shape as a plan view. As the leaf spring 56 has a small spring constant, the spring clamp 54 generates the elastic force by stacking a plurality of the leaf springs 56.

The compression member 57 has a semi-spherical shape so as to be in point contact with the leaf spring 56. The circular bottom surface of the compression member 57 has a size sufficient to be fit with the hole formed in the lid 51.

In the spring clamp 54, the compression member 57 is fit with the hole of the lid 51 of the cooling unit 50. A plurality of leaf springs 56 are stacked on the compression member 57. The clamp 55 is placed on the leaf springs 56 so as to be covered with the storage portion 55a. The leaf springs 56 are supported by the support portions of the lid 51 at both sides. The top surface of the stacked leaf springs 56 is higher than the support portions. The fastening portions 55c of the clamp 55 are aligned with respect to the fastening portions 55c of the clamps 55 at both sides such that the fastening portions 55c of the adjacent clamps 55 are fastened with bolts 59 and nuts 60 as shown in FIG. 10. The exhaust heat power generation apparatus 42 is fastened with four spring clamps 54 that are fastened along the periphery and functioning like a belt.

An operation of the exhaust system 41 will be described referring to FIGS. 7 to 11. The exhaust system 41 of this embodiment is the same as the exhaust system 1 in the previous embodiment except that the exhaust system 41 generates power without noise muffling by the sub muffler 4. The operation of the exhaust system 41 that is different from that of the exhaust system 1 will be described hereinafter.

In the exhaust heat power generation apparatus 42, the exhaust gas flows from the exhaust introduction pipe 44, and the cooling water flows from the cooling water pipes 53 connected to the radiator. The introduced exhaust gas is split by the split member 46a into each of the four divided exhaust passages 47. The introduced exhaust gas has been partially used for heating the three-way catalyst in the upstream catalyst 2 or consumed to be converted into electric energy. Therefore, the thermal energy of the introduced exhaust gas is lower than that of the exhaust gas to be introduced into the upstream catalyst 2.

In each of the divided exhaust passages 27, the exhaust gas passes through fins of the heat exchange fin 48b of the heat exchange member 48 and then flows downstream. The thermal energy of the exhaust gas is absorbed by the heat exchange fin 48b as it passes therethrough. The heat exchange member 48 transfers the absorbed energy to the high temperature end surface of the thermoelectric converting module 49.

The cooling water passes through fins of the cooling fin 52b in each of the cooling portions 52a of the cooling units 50, and flows downstream. The cooling unit 50 transfers the cooling water at the low temperature to the low temperature end surface of the thermoelectric converting module 49.

Each of the thermoelectric converting modules 49 generates power in accordance with the temperature difference between the high temperature transferred to the high temperature end surface and the low temperature transferred to the low temperature end surface. The resultant electric energy is charged in the battery. As the high temperature and the low temperature can be sufficiently held and the temperature difference becomes large, the generated power becomes substantially high.

Subsequent to collection of the thermal energy of the exhaust gas as the electric energy in the exhaust heat power generation apparatus 42, the exhaust gas is introduced into the main muffler 5. As the thermal energy of the exhaust gas has been already collected, the temperature thereof, thus, is lowered.

The exhaust system 41 is capable of collecting the thermal energy of the exhaust gas as electric energy in addition to the effect obtained by the previous embodiment, resulting in improved fuel efficiency. As the exhaust gas temperature is further reduced, the engine outputs can be improved.

As has been described with respect to the embodiments, it is to be understood that the invention may be embodied in various forms without being limited thereto.

In this embodiment, two catalytic systems are provided. However, the invention may be structured to include one catalytic system provided with the exhaust heat power generation unit. In the above case, the three-way catalyst is carried on the heat exchange fin in order to purify the exhaust gas that passes through the by-pass passages. In each of the aforementioned two catalytic systems, the same three-way catalyst is used for purifying the exhaust gas. However, different catalysts may be used in the respective catalytic systems in consideration with characteristics of the engine for purifying the exhaust gas. For example, one of the catalytic systems may use the oxidation catalyst, and the other may use the reduction catalyst.

In this embodiment, the catalytic system with the exhaust heat power generation unit is placed in the vicinity of the exhaust manifold. However, the catalytic system may be placed on an arbitrary position in the exhaust system. Alternatively the catalytic system may be placed within the exhaust manifold at the most downstream portion.

In the exhaust system according to this embodiment, two catalytic systems are provided at the upstream and the downstream sides, respectively. Then the valve opening is controlled based on the temperature in the catalysts in the respective catalytic systems. However, only one catalytic system with the exhaust heat power generation unit may be provided so as to control the valve opening such that the catalytic temperature becomes within the activated temperature range.

In this embodiment, the valve provided in the exhaust passage is controlled to be fully closed/opened. However, the valve opening may be controlled stepwise in accordance with the catalytic temperature. The valve to be driven by the actuator may be provided in the by-pass passage such that the valve opening can be controlled in accordance with the catalytic temperature.

In this embodiment, not only the cooling unit of water-cooling type but also air-cooling type may be employed.

The exhaust system of the invention may prevent degradation of the catalyst and collect the thermal energy from the exhaust gas efficiently, resulting in improved fuel efficiency.

What is claimed is:

1. An exhaust system comprising:
   an exhaust passage that allows exhaust gas discharged from an internal combustion engine to pass therethrough;
   a primary exhaust emission control unit including a catalyst to purify the exhaust gas;
   a first exhaust heat collecting unit including a thermoelectric element that converts thermal energy of the exhaust gas into electric energy, the exhaust passage being divided into a first passage provided with the primary exhaust emission control unit, and having a first inlet and a first outlet, defining a first flowpath, with an upstream end and a downstream end, and a cut-off valve downstream of the catalyst, and a second passage provided with the first exhaust heat collecting device including the thermoelectric element and having a second inlet and a second outlet, and an outlet door, the second outlet and the outlet door being downstream of the cut-off valve in said first passage; and
   a controller that controls said cut-off valve,
   wherein said cut-off valve is responsive to a signal from said controller,
   wherein in response to said signal from said controller, said cut-off valve either opens to allow exhaust gas to flow through said first passage, or closes to allow exhaust gas to flow through said second passage to said outlet door, said outlet door being closed when said cut-off valve is open, said outlet door being open when said cut-off valve is closed, and
   wherein said signal to open or shut said cut-off valve is sent based on a temperature in the catalyst.

2. The exhaust system according to claim 1, further comprising a secondary exhaust emission control unit provided on the exhaust passage where the first passage and the second passage are joined.

3. The exhaust system according to claim 2, wherein an operation of the control member is controlled based on a temperature in the secondary exhaust emission control unit.

4. The exhaust system according to claim 3, wherein the control member is operated such that the exhaust gas flows through the second passage when the temperature in the secondary exhaust emission control unit exceeds a predetermined temperature.

5. The exhaust system according to claim 4, wherein the predetermined temperature is determined based on an activation temperature of the catalyst in the secondary exhaust emission control unit.

6. The exhaust system according to claim 1, wherein:
   the first passage and the second passage are combined into a single structure;
   the first passage is provided in a center of the structure; and
   the second passage is provided on an outer periphery of the first passage.

7. The exhaust system according to claim 6, wherein the structure in which the first passage and the second passage are combined is placed in the vicinity of an exhaust manifold in the internal combustion engine.

8. The exhaust system according to claim 1, wherein:
   the second passage includes a heat exchange member that transfers heat of the exhaust gas to the exhaust heat collecting device; and
   the exhaust heat collecting device is provided with a catalyst for purifying the exhaust gas.

9. The exhaust system according to claim 8, wherein the catalyst is carried on the heat exchange member.

10. The exhaust system according to claim 1, wherein the control member serves to change each flow rate of the exhaust gas flowing into the first passage and the second passage.

11. The exhaust system according to claim 10, wherein the control member comprises a valve that is operated to close and open one of the first passage and the second passage at a predetermined degree.

12. An exhaust system, comprising:
    an exhaust passage that allows exhaust gas discharged from an internal combustion engine to pass therethrough;
    a primary exhaust emission control unit including a catalyst to purify the exhaust gas;
    a first exhaust heat collecting unit including a thermoelectric element that converts thermal energy of the exhaust gas into electric energy, the exhaust passage being divided into a first passage provided with the primary exhaust emission control unit and a second passage provided with the first exhaust heat collecting device including the thermoelectric element;

a control member that is operated to change a flow of the exhaust gas between the first passage and the second passage;
a secondary exhaust emission control unit provided on the exhaust passage where the first passage and the second passage are joined; and
a second exhaust heat collecting unit including a thermoelectric element downstream of the secondary exhaust emission control unit;
wherein an operation of the control member is controlled based on a temperature in the primary exhaust emission control unit;
the control member is operated such that the exhaust gas flows through the second passage when the temperature in the primary exhaust emission control unit exceeds a predetermined temperature; and
the predetermined temperature is determined based on an activation temperature of the catalyst in the primary exhaust emission control unit.

13. An exhaust system comprising:
an exhaust passage through which flows exhaust gas from an engine;
a first catalytic converter, including a primary passage, said primary passage including a first inlet, a first outlet, a first catalyst between said first inlet and said first outlet, and a cut-off valve downstream of said catalyst, and a by-pass passage, including a second inlet, a second outlet, an exhaust heat power generator unit between the second inlet and the second outlet, and an outlet door with which the second outlet is provided, the second outlet and outlet door being downstream of said cut-off valve;
a controller including a temperature sensor for measuring temperature of said first catalyst and for providing signals to said cut-off valve in response to preselected temperature setpoints;
wherein at a first temperature setpoint, said cut-off valve opens, providing exhaust gas flow through said primary passage, said exhaust gas flow holding shut said outlet door of said by-pass passage; and
wherein at a second setpoint, said cut-off valve closes, preventing exhaust gas flow in said primary passage, allowing said outlet door of said by-pass passage to open, and providing exhaust gas flow through said by-pass passage.

14. The exhaust system of claim 13, further comprising heat exchange fins provided in said by-pass passage.

15. The exhaust system of claim 13, wherein said exhaust heat power generation unit includes a thermoelectric conversion module.

16. The exhaust system of claim 13, further comprising a second catalytic converter in the exhaust passage downstream of the first catalytic converter.

17. The exhaust system of claim 13, wherein said primary passage and said by-pass passage are substantially parallel to one another.

* * * * *

UNITED STATES PATENT AND TRADEMARK OFFICE
CERTIFICATE OF CORRECTION

PATENT NO. : 7,150,147 B2 Page 1 of 1
APPLICATION NO. : 10/540529
DATED : December 19, 2006
INVENTOR(S) : Kiyohito Murata It is certified that error appears in the above-identified patent and that said Letters Patent is hereby corrected as shown below:

Title page, item (73) after "Toyota Jidosha Kabushiki Kaisha" insert --Toyota-shi,--.

Signed and Sealed this

Twenty-ninth Day of May, 2007

JON W. DUDAS
*Director of the United States Patent and Trademark Office*